United States Patent

Maruyama et al.

[11] Patent Number: 6,069,793
[45] Date of Patent: May 30, 2000

[54] CIRCUIT MODULE AND INFORMATION PROCESSING APPARATUS

[75] Inventors: Takashi Maruyama, Ebina; Akira Yamagiwa, Kanagawa-ken; Ryoichi Kurihara, Hadano; Masakazu Sakaue, Atsugi; Yasuhiro Uemura; Mikihiro Tanaka, both of Hadano, all of Japan

[73] Assignee: Hitachi, Ltd., Tokyo, Japan

[21] Appl. No.: 09/010,185

[22] Filed: Jan. 21, 1998

[30] Foreign Application Priority Data

Jan. 24, 1997 [JP] Japan ..................................... 9-010954
Dec. 17, 1997 [JP] Japan ..................................... 9-347531

[51] Int. Cl.[7] ..................................................... H05K 7/20
[52] U.S. Cl. ......................... 361/687; 361/707; 361/761; 361/818; 174/15.2; 165/104.33; 165/80.3
[58] Field of Search ................................... 361/687, 699, 361/700, 704–707, 816, 818, 733, 761–764; 165/104.33, 185, 80.3, 80.4; 174/15.2

[56] References Cited

U.S. PATENT DOCUMENTS 5,315,482  5/1994  Tanaka et al. .
5,557,502  9/1996  Banerjee et al. ........................ 361/764
5,631,807  5/1997  Griffin .................................... 361/764
5,701,231  12/1997 Do et al. ................................ 361/687
5,710,733  1/1998  Chengson et al. ..................... 361/764
5,712,762  1/1998  Webb ..................................... 361/687
5,847,935  12/1998 Thaler et al. .......................... 361/761

*Primary Examiner*—Leo P. Picard
*Assistant Examiner*—Lisa Lea-Edmonds
*Attorney, Agent, or Firm*—Beall Law Offices

[57] ABSTRACT

The present invention provides an information processing apparatus that may be designed in small and thin size and a small and thin CPU module that has a nigh heat releasing effect and is suitable therefor. The CPU module includes a processor, a connector to be electrically connected to the outside, a system control circuit for controlling transfer of a signal between the processor and the connector, and a printed board on which the processor, the connector and the system control circuit are mounted. The CPU module further provides a heat release plate one side of which is pasted with the printed board and the other side of which is substantially planar. The printed board has a cavity formed therein so that the processor may be fitted in the cavity in a bare-chip state. One side of the bare chip is jointed with the heat release plate.

13 Claims, 12 Drawing Sheets

CIRCUIT MODULE AND INFORMATION PROCESSING APPARATUS

BACKGROUND OF THE INVENTION

The present invention relates to a mounting structure which may suitably apply to an information processing apparatus such as a personal computer, and more particularly to an information processing apparatus which is arranged to both enhance heat relase efficiency and reduce its size.

The information processing apparatus such as a personal computer has been designed to increase the processing speed and reduce the bulk. In order to meet these requirements and facilitate the upgrade of a CPU built therein, the recent information processing apparatus has a tendency of providing a modular CPU. The LSI element containing a CPU is directed to larger power consumption and a larger heat relase relevant thereto because of the increase of the processing speed. Also in case the semiconductor element with a large heat developed is modularized, the semiconductor is also required to dissipate heat. The heat-dissipating structure provided with the modular CPU has been heretofore known in JP-A-5-110277 (corresponding to the U.S. Pat. No. 5,315,482), for example. This prior art describes the mounting structure wherein a radiating fin for diffusing heat is integrally molded with the CPU module.

However, the prior art is arranged to mount components and a radiating fin on both sides of a circuit module. It means that the prior art does not take into sufficient consideration the possible use of itself in a small-sized thin information processing apparatus.

Further, it also does not make a sufficient allowance for efficient heat dissipation to be considered in the case of mounting itself to a personal computer.

SUMMARY OF THE INVENTION

It is an object of the present invention to provide a CPU module which is suitable to a small-sized information processing apparatus such as a personal computer.

It is a further object of the present invention to provide a CPU module which meets a requirement for reduction in size as positively taking the measure for heat release.

It is another object of the present invention to provide a thin information processing apparatus which provides excellent heat release.

In carrying out the objects, a CPU module having a processor, a connector to be electrically connected to the outside, a system control circuit for controlling transfer of a signal between the processor and the connector, and a printed board on which the processor, the connector and the system control circuit are mounted thereon, includes:

a heat release plate such as a metal plate or a heat pipe pasted on its one side with the printed board; and the printed board having a cavity in which the processor is mounted in a bare-chip state, one side of which is pasted with the heat release plate.

The processor is pasted with the heat release plate in the bare-chip state, so that the heat radiated by the processor is conducted to the heat release plate from which the heat is dissipated. This results in sufficiently cooling down the processor.

In the case that the other side of the heat release plate is mounted on the information processing apparatus such as a personal computer in contact with a member such as a box of the apparatus, the heat is conducted through the box. Hence, the heat release effect is further enhanced when the CPU module is mounted on the information processing apparatus.

Since only one side of the CPU module is used for mounting the relevant components thereon, the CPU module may be made thinner. The combination of this design and the bare-chip mount makes it possible to far more reduce the CPU module in size. It leads to reduction of the overall information processing apparatus where the processor is to be mounted in size and thickness.

The CPU module is further effective in reducing the overall information processing apparatus because of the possible mount of the CPU module to a mother board so that the CPU module itself is served as part of an electromagnetic shield of the information processing apparatus.

Moreover, by sealing the cavity with a member having a lower heat conductivity than the heat release plate, it is possible to prevent the heat from being upwardly conducted and increase a heat releasing factor from the heat release plate side. The reduction of the radiation onto the side with the connector makes it possible to reduce the heat conduction to the mother board side.

On the top of the sealed cavity is mounted a second substrate with a small gap therebetween so that the necessary electronic components may be mounted on the second substrate. The small gap does not bring about any convention current of the air inside of the gap, so that the gap itself is effective in insulating the heat. Hence, the effect described in the previous paragraph is further enhanced. In addition, the stepwise mount of components on the substrate where the processor is mounted results in reducing the module itself in area.

In case the electronic components to be mounted on the second substrate are a cache memory and a cache memory control mechanism both of which are strongly associated with the processor, the necessary signal lines between those components and the processor may be reduced in length. This makes it possible to further increase the processing speed and the reliability.

Since the cache memory to be mounted on the second substrate is in the bare-chip state, the height and the area of the CPU module can be suppressed.

In place of mounting the processor in the bare-chip state, the processor may be mounted in a face-down state so that the processor is connected with the substrance by means of a metal bump and in a chip-size-package state. Though the latter two mounting states offer lower effects than the bare-chip state, the objects of the invention of the present application can be achieved to some extent.

On the other hand, the CPU module has been heretofore the highest one among the components to be mounted on the mother board of a notebook personal computer. This has been an obstacle to reducing the notebook personal computer in size.

It is another object of the present invention to make the notebook personal computer free of the restriction in height imposed by the CPU module.

In carrying out the object, the height of the CPU module to the mounting level is restricted to 10 mm. or lower. The current notebook personal computer is frequently required to have a PC card slot for accommodating two PC cards in vertical, the PC cards standardized by the PCMCIA (Personal Computer Memory Card International Association). For the convenience of this standard specification in height, the notebook personal computer cannot be lower than 10.5 mm. The present invention provides the CPU module whose height from the mounting level is equal to or lower than 10 mm. Hence, the CPU module does not put a height limitation to designing the notebook personal computer, so that the CPU module makes great contribution to implementing a thin notebook personal computer.

In order to achieve the CPU module that is equal to or lower than 10 mm, the processor is mounted in the cavity and all other components can be mounted on the side where the highest component, that is, the connector s mounted.

DETAILED DESCRIPTION OF THE PREFERRED EMBODIMENTS

Hereafter, the embodiments of the invention will be described in detail with reference to the appended drawings.

Figure 1:
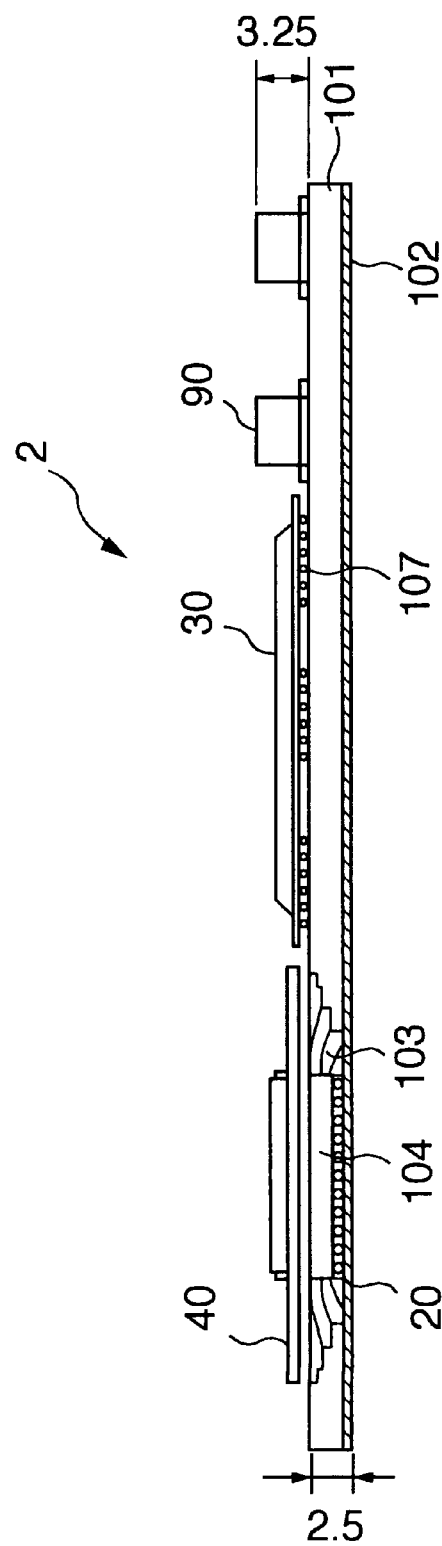
FIG. 1 is a sectional view showing a CPU module according to a first embodiment of the present invention.
Figure 2:
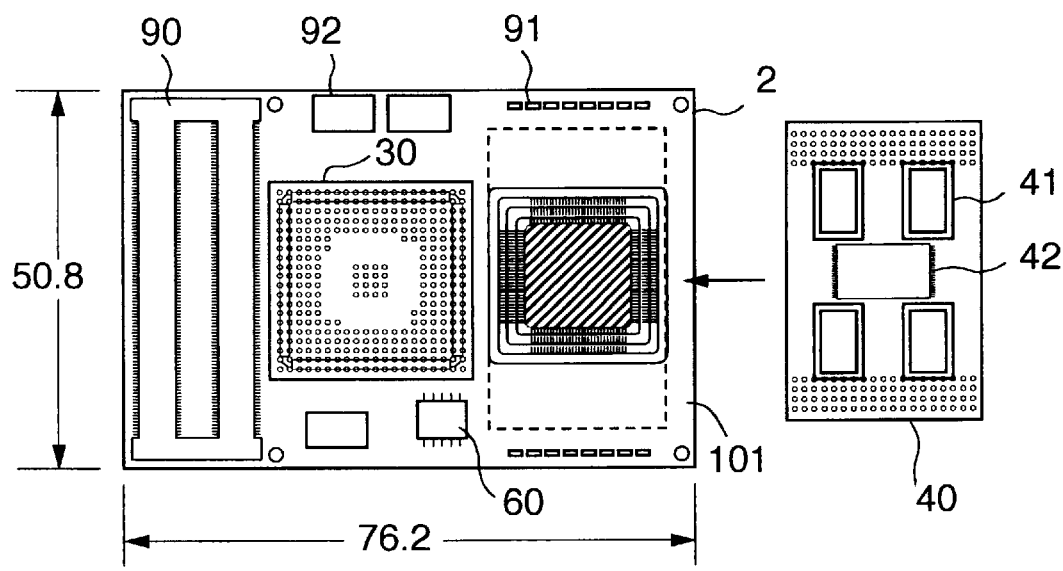
FIG. 2 is a top view showing the CPU module according to the first embodiment.
Figure 3:
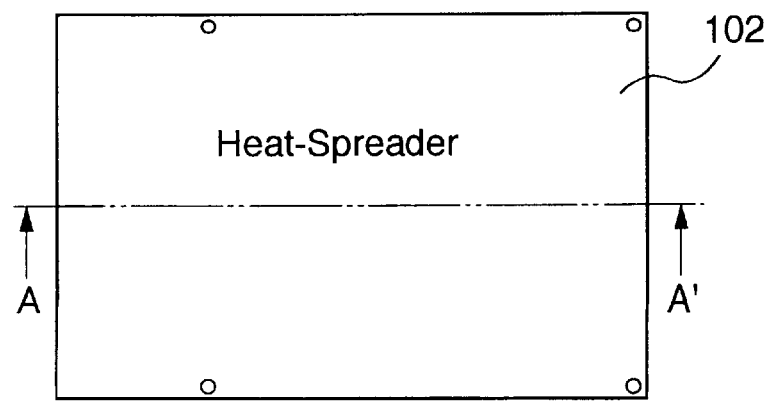
FIG. 3 is a back view showing the CPU module according to the first embodiment.

FIG. 1 is a sectional view showing a CPU (Central Processing Unit) module according to an embodiment of the invention. FIGS. 2 and 3 are front views and back views of the CPU module. The sectional view of FIG. 1 is cut on the line A–A' of FIG. 3. As shown, the CPU module 2 is structured to have as a base a metal plate 102 served as a heat release plate for diffusing the heat caused by a processor, a CPU bare chip 20 that consumes almost all of the electric power of the CPU module 2 and developes a large amount of heat, and a CPU module substrate 101 connected to the CPU bare chip 20. To keep the processor in contact with the metal plate 102, the CPU module substrate 101 contains a cavity (through hole) formed therein.

The CPU bare chip 20 is electrically connected with the CPU module substrate 101 by means of a bonding wire 103 made of pure gold, for example. The bare chip is a chip that has no package made of resin, for example and whose metal is thus literally exposed. The gap formed between the cavity portion of the CPU module substrate 101 and the bonding wire 103 is filled with potting resin 104 so that the cavity portion of the CPU module substrate 101 is buried with the potting resin and the CPU module substrate 101 is made rectangular. The potting resin has a lower heat conductivity than the metal plate. The CPU module substrate 101 composed as described above includes main components such as a cache sub-module 40, a system controller 30, and an interface connector 90. In this embodiment, the system controller is a BGA (ball grid array).

The CPU module may be remarkably reduced in size, because the cache sub-module 40 is mounted on the portion where the processor is mounted.

The connector to be connected with the mother board has the highest physical component. In this embodiment, the connector has a height of 3.25 mm. Hence, the overall height of the CPU module is as low as 5.75 mm, that is, the combination of the connector's height 3.25 mm. and the substrate's height 2.5 mm. This is a super thin CPU module.

Figure 7:
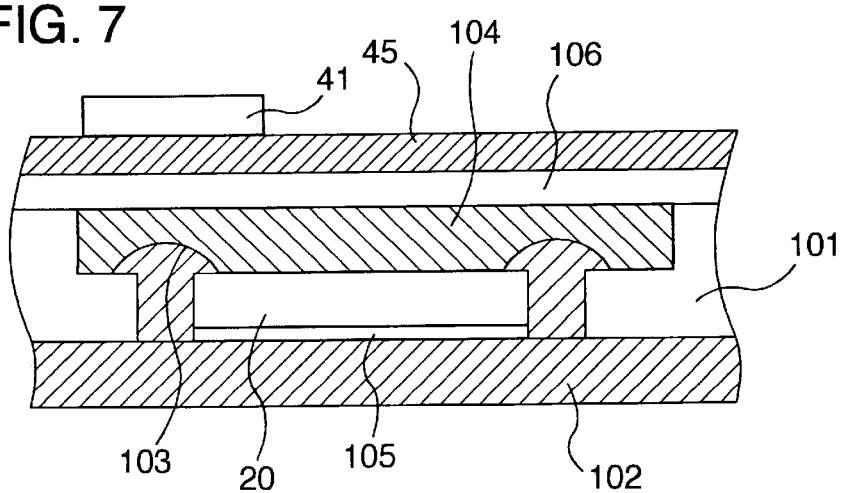
FIG. 7 is an expanded view showing a sectional structure of a processor mounting portion of the CPU module according to the first embodiment of the invention.

FIG. 7 is an expanded view showing the sectional structure for describing the important points of the sectional view of FIG. 1 in a scale-up manner. The structure shown in FIG. 7 will be described from the bottom. The CPU module substrate 101 coated with a bonding agent is connected onto the metal plate 102. A silver paste 105 that is a conductive bonding agent is coated on the metal plate 102 of the cavity of the CPU module substrate 101. On the metal plate 102 covered with the sliver paste 105 is mounted the CPU bare chip 20. The CPU bare chip 20 is electrically connected with the CPU module substrate 101 by means of the bonding wire 103 and the gap therebetween is filled with the potting resin. In this state, the metal is connected in the lower portion so that the heat resistance is made lower downwardly, while the resin is filled in the upper portion so that the heat resistance is made higher upwardly.

Further, since a cache sub-module substrate 45 is located on the CPU module substrate 101 with an air gap 106 therebetween, the heat resistance is made far higher upwardly, so that almost all of the heat is conducted downwardly. As a result, the heat conduction to the cache sub-module substrate 45 becomes so small that the electronic components/circuits such as a cache SRAM 41 may be mounted on the substrate 45. A thin air layer hardly brings about a heat convention flow and thus serves to thermally insulate the substrate 45. The BGA used in this embodiment has a gap of about 0.5 mm., which offers a sufficient thermal insulating effect. This kind of structure enables to control the direction of heat release.

FIG. 2 is a top view showing the CPU module according to the embodiment, in which the same components as those shown in FIG. 1 has the same reference numbers. In the following figures, the same components have the same reference numbers.

In FIG. 2, a clock driver 60 may not necessarily mounted on the CPU module 2 in any system. A clock may be supplied from the external such as a mother board through the interface connector 90. 91 denotes a series of small chip components that include a chip ceramic capacitor mounted for suppressing noises of a relatively high frequency area, a chip resistor used for bus pull-up, pull-up and pull-down for initializing strapping, and damping of signal, a chip thermistor used as a temperature sensor, and so forth. 92 denotes large chip components, which include a large-capacitance chip tantalum capacitor for absorbing power noises of a relatively high frequency area caused when the CPU bare chip 20 is returned from a clock stopping state, it restarts the clocking and then it transits to the normal operating state, an intelligent temperature sensor for sensing a temperature and transmitting temperature information through a serial bus, a group of a DC/DC converter, a coil and a large-capacitance capacitor required for producing a special supply voltage required by the CPU module 2, and so forth.

The cache sub-module 40 contains a necessary number of asynchronous or clock synchronous SRAM41s for storing data according to the necessary cache volume. For example, if a volume of 256 kB is needed, two caches SRAM41 each with 1 Mb of volume are mounted. If a volume of 512 kB is needed, four caches SRAM41 each with 1 Mb of volume are mounted.

Since the cache sub-module 40 has four mounting spaces, the placement of two caches SRAMs4l each with a volume of 2 Mb leads to securing a cache volume of 1 MB. The cache sub-module 40 may further mount a cache TAG SRAM42 for storing part of an address of data stored in the cache SRAM 41, and if necessary, a chip ceramic capacitor for decoupling and a jumper chip resistor for selecting a cache volume of 256 kB with two caches SRAM41 each having one Mb or a cache volume of 512 kB with four caches SRAM41. The volume and the bit arrangement required for the TAG SRAM42 according to the cache capacitance are made various according to the caching system. Hence, they are not described herein. Since the module is arranged to have four cache mounting patterns, the caches may be mounted to the CPU module without changing the size of the cache and as keeping the standard composition. This leads to enhancing the allowance in design.

The caches SRAM41 and TAG SRAM42 may be both molded of plastic or ceramics if both are bare chips or one of the caches may be molded if one of the caches is a bare chip. In this embodiment, the cache SRAM41 uses a bare chip and the cache TAG SRAM42 uses TSOP molded of plastic. By using the bare chip, the small and thin CPU module may be realized.

FIG. 3 is a back view showing the CPU module according to the embodiment of the invention. FIG. 3 illustrates the form of the metal plate 102 used for a heat release plate. As shown in FIG. 3, since the metal plate 102 merely provides plural holes for fixing, the metal plate 102 has no electronic components mounted thereon and is served as a horizontal plane type thermal interface. Since the thermal interface has a low heat resistance and a simple form, the heat radiating structure of the information processing apparatus may be easily designed. The structure utilizes the box of the information processing apparatus and it is thus suitable to the heat release, so that it offers a higher heat releasing effect.

Figure 4:
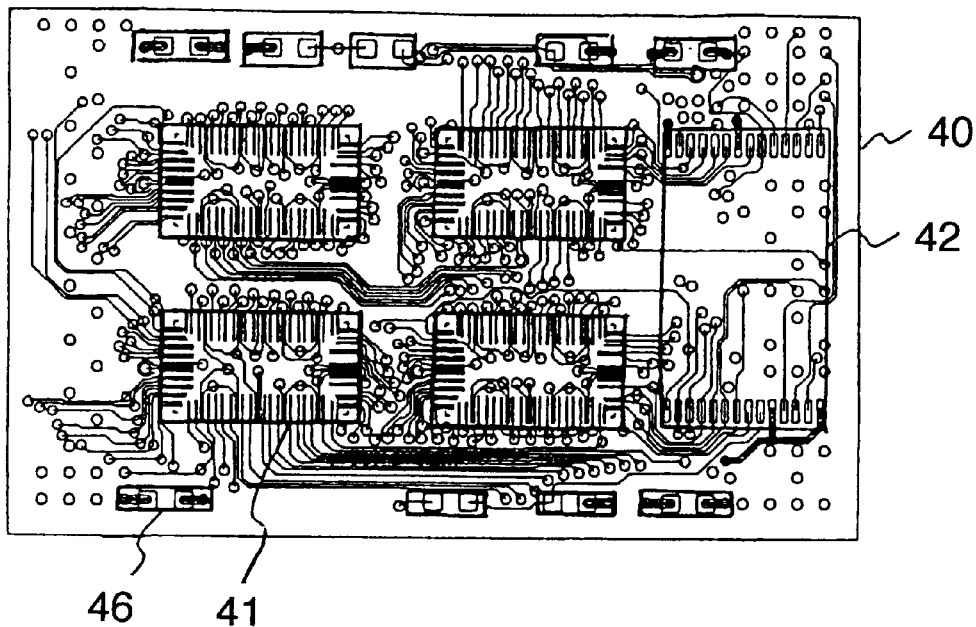
FIG. 4 is a view showing an example of a pattern of a components-mounting plane of the CPU module.

FIG. 4 shows an example of a component plane pattern of the cache sub-module 40, which illustrates the mounting pattern and the positions of the cache SRAM41 coming in a bare state and a cache TAG SRAM42 coming in a TSOP state. In FIG. 4, a chip component 46 corresponds to the mounting pattern and positions of a chip ceramic capacitor for decoupling and a jumper chip resistor.

Figure 5:
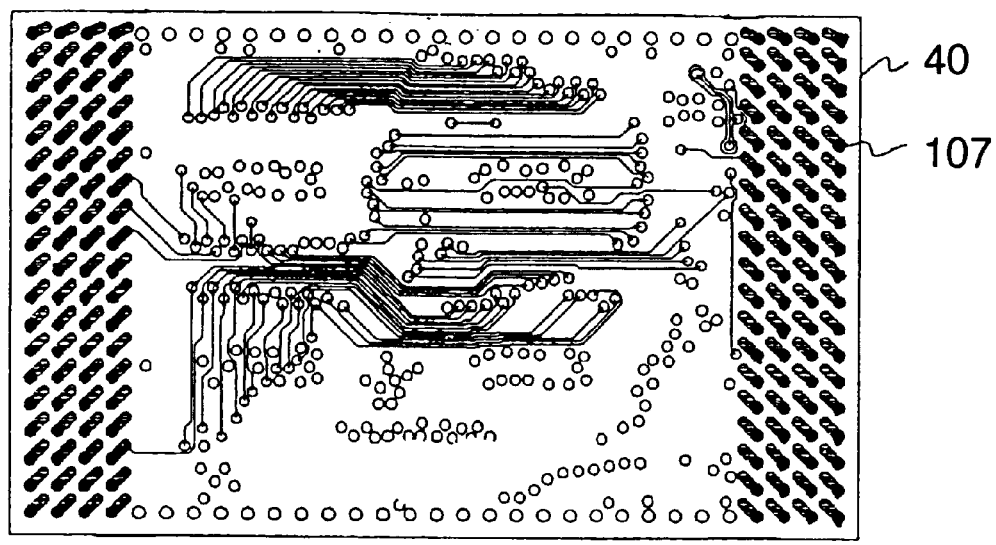
FIG. 5 is a view showing an example of a pattern of a soldering plane of the CPU module.

FIG. 5 shows an example of a soldering plane pattern of the cache sub-module 40. The cache sub-module 40 is electrically and mechanically connected with the CPU module substrate 101 by means of a solder ball 107. In this embodiment, a round land array on which the solder balls 107 are mounted is located on each short side of the cache sub-module 40. This is because the cache sub-module 40 is laid to cover the cavity where the CPU bare chip 20 is fitted.

The array of 152 round lands for solder balls 107 is not definitively directed to the BGA (Ball Grid Array) with the solder balls but also to the LGA (Land Grid Array) in which the solder is printed on both of the lands of the side of the cache sub-module 40 and the CPU module substrate 101. The mounting method of the cache sub-module 40 is not limited to a specific mounting form such as the BGA or the LGA. However, those mounting forms are preferable in the case of considering the thinning of the CPU module.

In turn, the description will be oriented to the CPU module (circuit module) according to the second embodiment of the present invention with reference to FIGS. 14 to 17. The different respect of the second embodiment from the first embodiment is the use of a heat pope 110 in place of the metal plate 102 used in the first embodiment. The arrangement of the second embodiment except this respect is likewise to that of the first embodiment.

Figure 14:
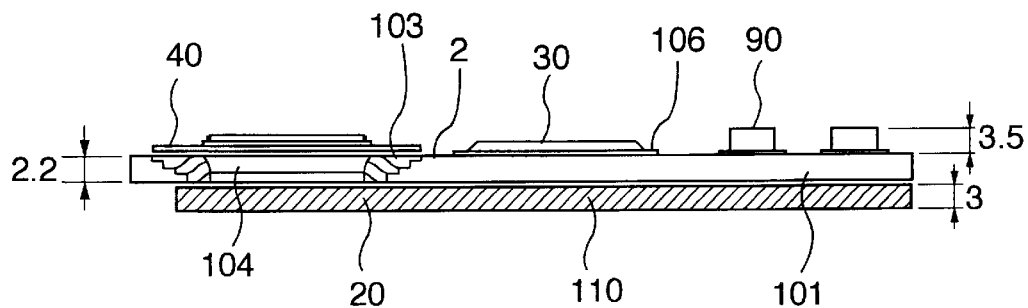
FIG. 14 is a sectional view showing a CPU module according to a second embodiment of the invention.

FIG. 14 is a sectional view showing the CPU module (circuit module). This figure shows the section of the CPU module at the same location as that of the first embodiment. In the second embodiment, the CPU module 2 has a structure wherein a CPU bare chip 20 for consuming an almost of electric power of the CPU module is connected with the CPU module substrate 101 with the heat pipe 110 as the base, the heat pipe 110 serving to diffuse the heat caused by the processor. In order to keep the processor in contact with the heat pipe 110, the CPU module substrate 101 has a cavity (through hole) formed therein. The processor is jointed with a heating portion of the heat pipe 110.

The gap formed between the CPU module 2, the cavity of the CPU module substrate 101 and the bonding wire 103 has a lower heat conductivity than the heat pipe or the bonding resin 104 with which the cavity of the CPU module substrate 101 is buried.

The other arrangement of the second embodiment is likewise to that of the first embodiment.

The heat pipe contains a medium for conducting heat inside of a container provided with a heating portion and a radiating portion. The medium is sealed therein. The medium is abruptly gasified on the heating portion by the heat developed by a heating body and then the heating portion is abruptly cooled by latent heat of vaporization. The vapor is moved to the radiating portion by virtue of the pressure difference and is condensed in the radiating portion so that the latent heat is dissipated. The condensed medium is permeated through a wick on the inner wall of the container and is returned to the heating portion by virtue of the capillary phenomenon.

Also in the second embodiment, a connector to be connected with the mother board has the highest physical height. In actual, the connector is as high as 3.25 mm. The height of the connector is combined with the heights of the heat pipe 110 and the CPU module substrate 101, concretely, 5.2 mm. Hence, the resulting circuit module is as thin as 8.45 mm.

Figure 15:
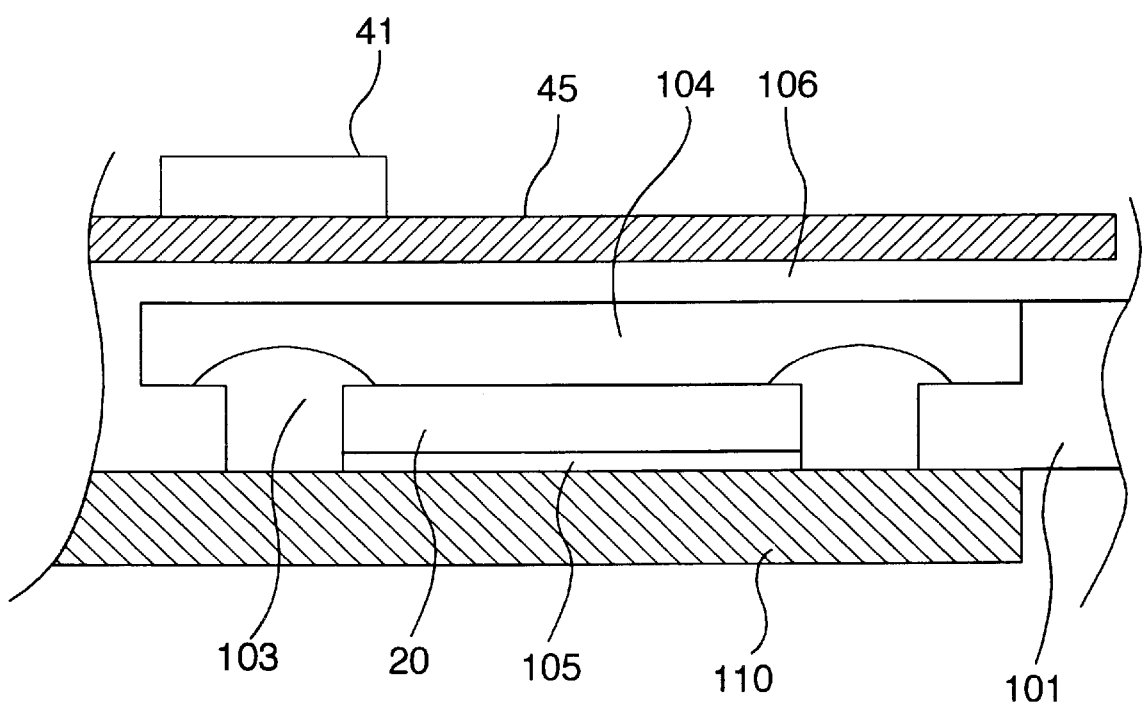
FIG. 15 is an expanded view sowing a sectional structure of the CPU module according to the second embodiment of the invention.

FIG. 15 is an expanded view showing a sectional structure for expansively describing an important portion of the sectional view of FIG. 14 for showing the CPU module 2.

The description will be expanded from the bottom of the figure. The CPU module substrate 101 with an adhesive material coated thereon is connected on the heat pipe 110. A silver paste 105 that is a conductive bonding material is coated on the corresponding portion of the heat pipe 110 to the cavity of the CPU module substrate 101. Then, the CPU bare chip 20 is mounted on the silver paste 105. The CPU bare chip 20 is electrically connected with the circuit module substrate 101 by means of the bonding wire 103. Next, the cavity is buried with the potting resin.

Figure 16A:
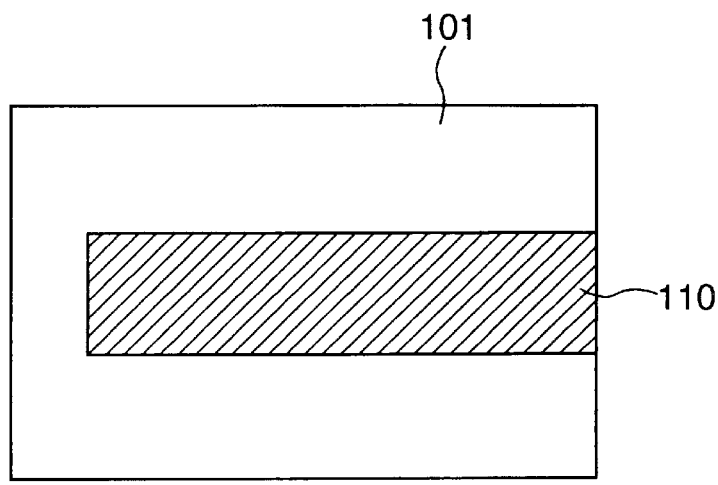
FIGS. 16A, 16B, 16C, 16D and 16E are back views showing the CPU module according to the second embodiment of the invention.
Figure 16B:
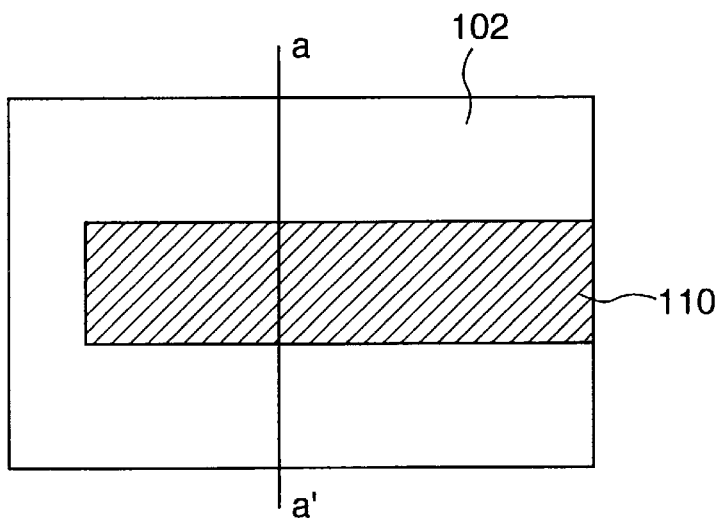
Figure 16C:
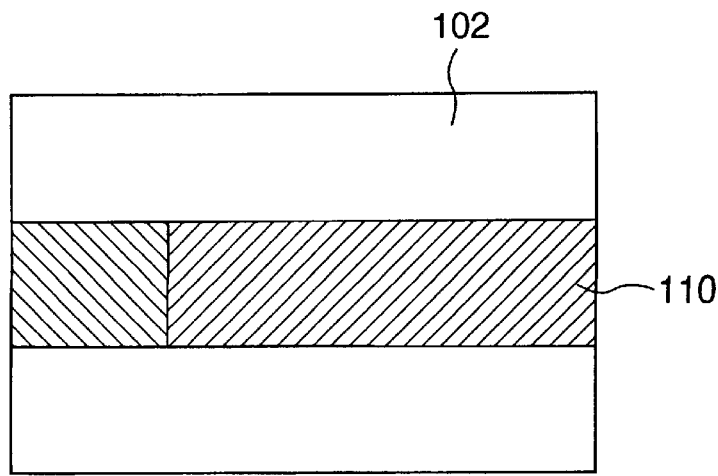
Figure 16D:
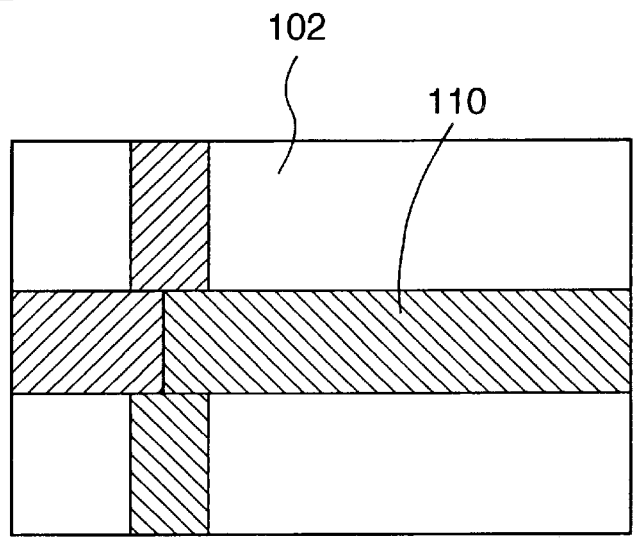
Figure 16E:
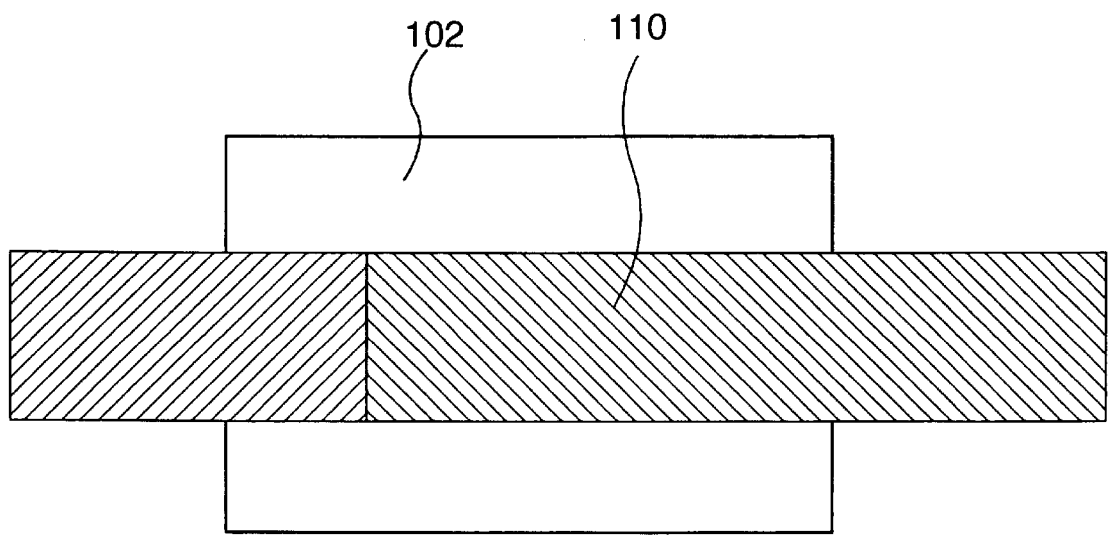

FIGS. 16A to 16E illustrate various embodiments having the corresponding sizes and compositions of the heat pipe. FIG. 16A shows one heat pipe pasted on the printed board. FIG. 16B shows the integral mold of the heat pipe and the metal plate being pasted on the printed board. FIG. 16C shows the integral mold of the metal plate and two heat pipes longitudinally ranged in one line being pasted on the printed board. The use of one or two or more of the heat pipes having a more excellent heat conductivity than the metal plate so that the destination of heat conduction may be more easily controlled makes it possible to uniformly dissipate heat in a thinner form and to a wider range than the use of just one metal plate pasted on the printed board. FIG. 16D illustrates the integral mold of the metal plate with two combinations of the foregoing two heat pipes crossed at right angles being pasted on the oriented board. FIG. 16E illustrates the integral mold of the metal plate with the heat pipes having larger lengthwise and lateral sizes being pasted on the printed board.

The heat pipe located and laterally extended to cover the cavity of the printed board is the most approximate in the case of considering a cooling capability of the heat pipe, fixation of the potting resin, an electromagnetic shield, and so forth.

As described above, the simple thermal interface arranged to efficiently release heat makes it possible to more easily design the heat releasing structure of the information processing system. The resulting structure is approximate to heat release by using the box of the information processing apparatus, so that it offers a higher effect of heat release.

Figure 17A:
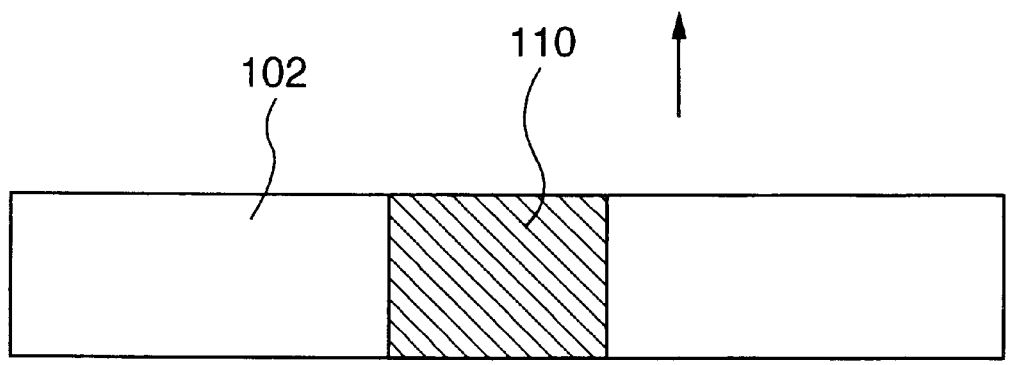
FIGS. 17A and 17B are sectional views showing a heat release plate of the CPU module according to the second embodiment of the invention.
Figure 17B:
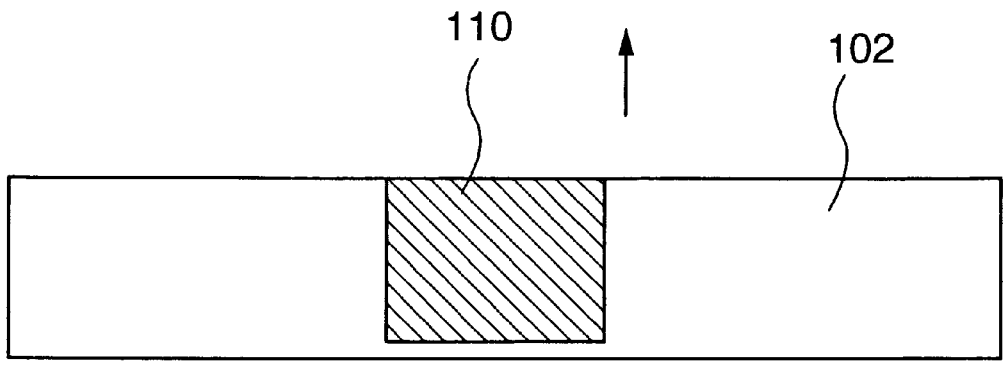

FIGS. 17A and 17B are sectional views cut on the a–a' of FIG. 16B. FIGS. 17A and 17B shows an embodiment where the heat pipe is integrally molded with the metal plate.

Figure 6:
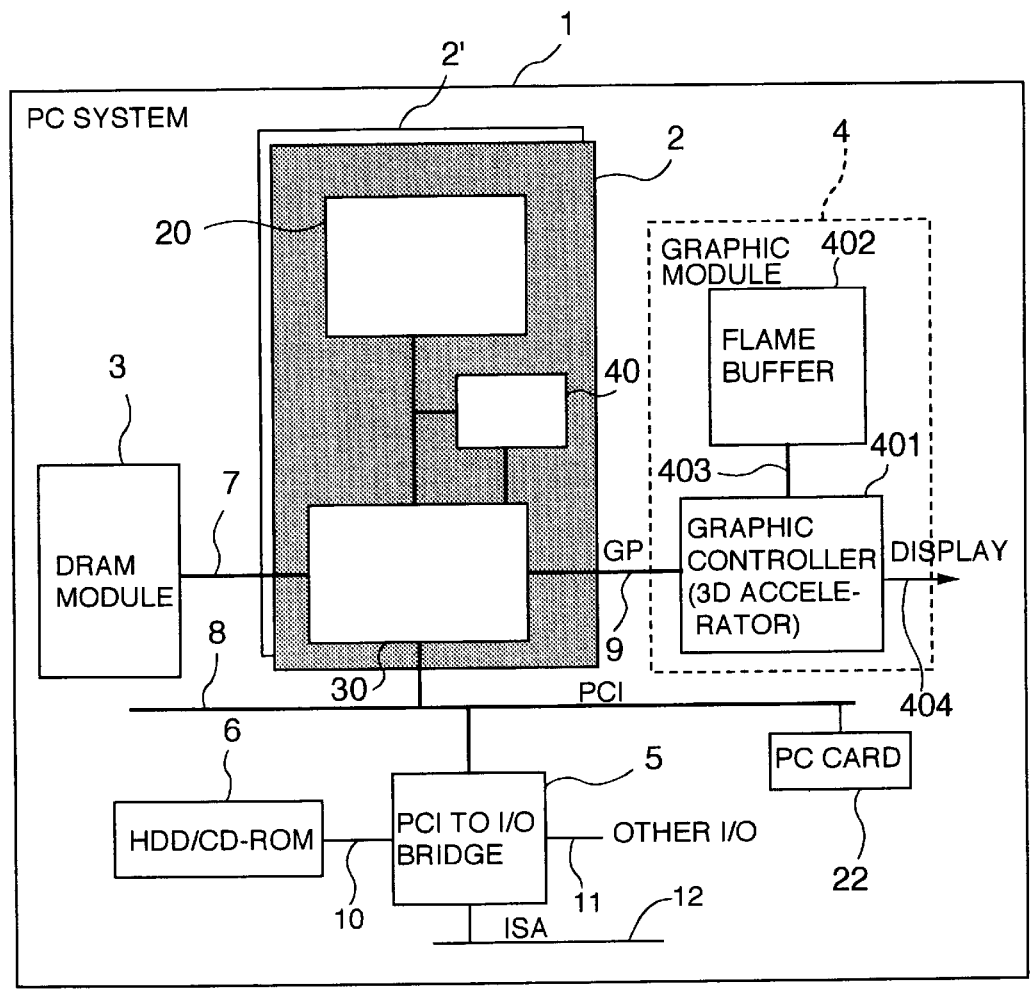
FIG. 6 is a system block diagram showing an information processing apparatus according to the present invention.

FIG. 6 is a system block diagram showing the mount of the CPU module on the information processing apparatus. FIG. 6 shows an example of an overall system of the information processing apparatus 1. Later, the description will be expanded along the first embodiment of the CPU block. However, it goes without saying that it holds true to the CPU module of the second embodiment.

The information processing apparatus may be a single processor system or a multiprocessor system. The single processor system is composed of only one CPU module 2. The multiprocessor system is composed of two or more modules including the CPU module 2 and the CPU module 2'. The CPU module 2 has an interface connector 90 shown in FIGS. 1 and 2 as a physical interface. Logically, the CPU module 2 has as an interface a system bus 8 such as a DRAM interface 7 for a bus of a main storage or a PCI (Peripheral Component Interconnect) for a general-purpose system bus. Further, the CPU module 2 may have as another interface a dedicated graphic port 9 taking an interface with a graphic controller required to transfer data at a faster speed. As set forth above, the CPU module 2 includes the CPU bare chip 20, the system controller 30, and the cache sub-module 40 connected mainly through a CPU bus 50. The system controller 30 has a CPU bus interface function, a cache control function, a DRAM interface function, a system bus interface function, and a dedicated port control function and is served as a bridge. The CPU module 2 is located centrally of the PC system. The CPU module 2 is connected to a DRAM module 3 through a DRAM interface 7, a graphic module 401 through a graphic port 9, and a frame buffer 402 through a frame buffer interface 403 so that the graphic module 401 can drive the display through a display signal 404. In place, the general system having no graphic-leased interface is connected to a graphic module having an equivalent function to the graphic module 4 through the system bus so that the general system can display text and graphics on a CRT or a LCD.

The system bus 8 may be connected to various function blocks such as a network controller and a SCSI controller. For example, the system bus 8 is connected to a communication PC card 23 to be inserted into a PC card slot. For example, the use of only a relatively new standard and a fast system bus such as the PCI makes it difficult to connect to an I/O unit having the conventional interface and enhances the cost. Hence, a PCT to I/O bridge 5 is connected to the system bus 8. This bridge 5 serves to bridge with the conventional interfaces such as IDE10 and ISA12. The IDE10 is connected to an inexpensive HDD/CD-ROM drive 6. The ISA12 is not fast enough to bring about a drawback.

Further, the system bus 8 is also connected to a sound controller and a modem. The other I/O interface 11 is connected to a floppy disk unit, a keyboard and a pointing device, for example.

Figure 12:
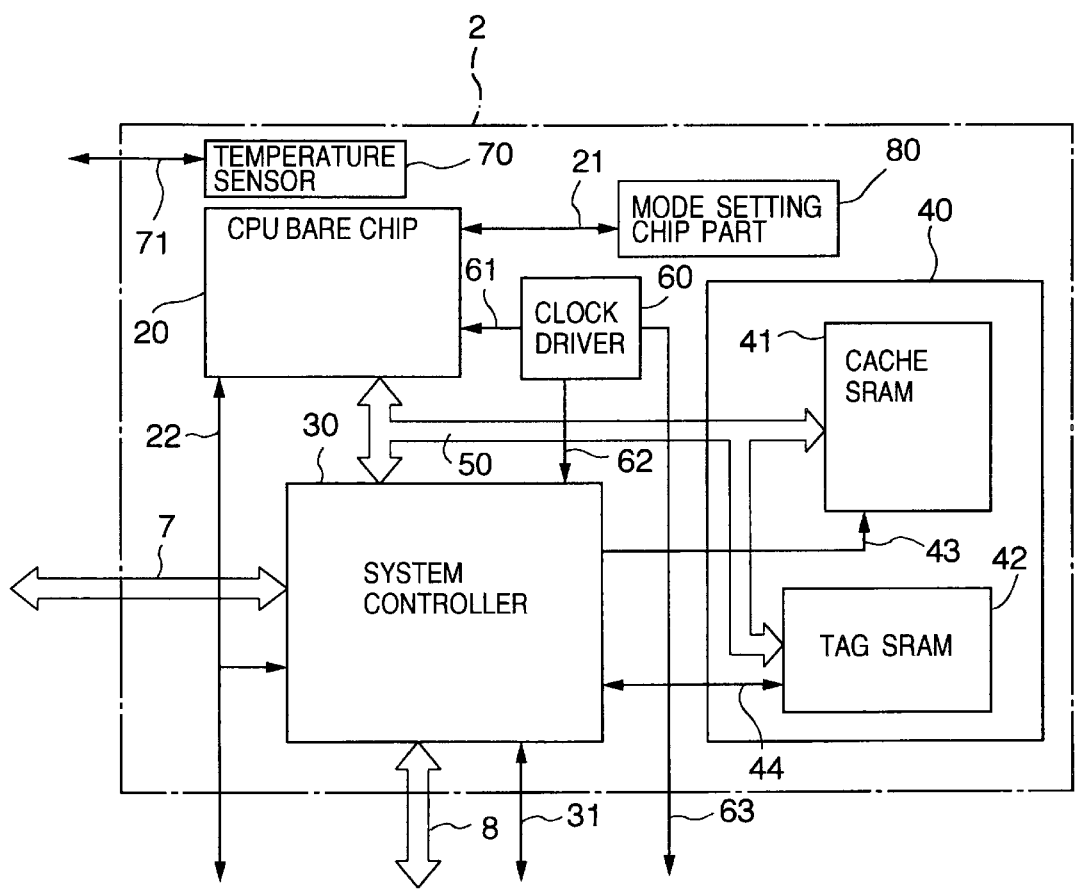
FIG. 12 is a block diagram of a CPU module.

In turn, the functional structure of the CPU module 2 will be described in detail with reference to FIG. 12. FIG. 12 is a block diagram showing the CPU module. As described above, the CPU module 2 includes the CPU bare chip 20, the system controller 30 served as a bridge and having the CPU bus interface function, the cache control function, the DRAM interface function and the system bus interface function, and the cache sub-module 40, which are connected through a CPU bus 50. This arrangement has been already described above. Herein, the description will be oriented to the detail portions rather than this rough arrangement.

A temperature sensor 70 is mounted physically closer to the CPU bare chip 20 and serves to output a temperature sensor signal 71. A numeral 80 denotes a mode setting chip part 80 for setting a mode setting signal 21 for specifying an operating mode at which the CPU bare chip 20 is operated after t is powered on or reset.

The CPU bare chip 20 is operated at clocks. A CPU clock signal 61 is driven by a clock driver 60. This clock driver 60 also drives a clock signal for the system controller and a clock signal 63 for a mother board. In case that the DRAM interface 7 supports a synchronous DRAM to be synchronized with the clock, the clock driver 60 also feeds clocks to the DRAM interface 7.

In place of the system where the clock driver 60 drives the clock signal 63 for the mother board, the clock driver 60 is mounted on the mother board so that the clock driver 60 may feed a clock signal to the CPU bare chip 20 and the system controller 30. The CPU bare chip 20 feeds normal operation signals as well as contains a diagnosis bus 22. The system controller 30 may be also connected to the diagnosis bus 22.

The cache sub-module 40 has a cache SRAM 41 and a TAG SRAM 42. The cache SRAM 41 is connected to the CPU bus 50 as well as a cache control signal 43. The TAG SRAM 42 is connected to part of an address signal of the CPU bus 50 as well as a TAG data/write control signal 44.

Further, the system controller 30 also includes the other control signals 31 such as a control signal for power management.

Figure 8:
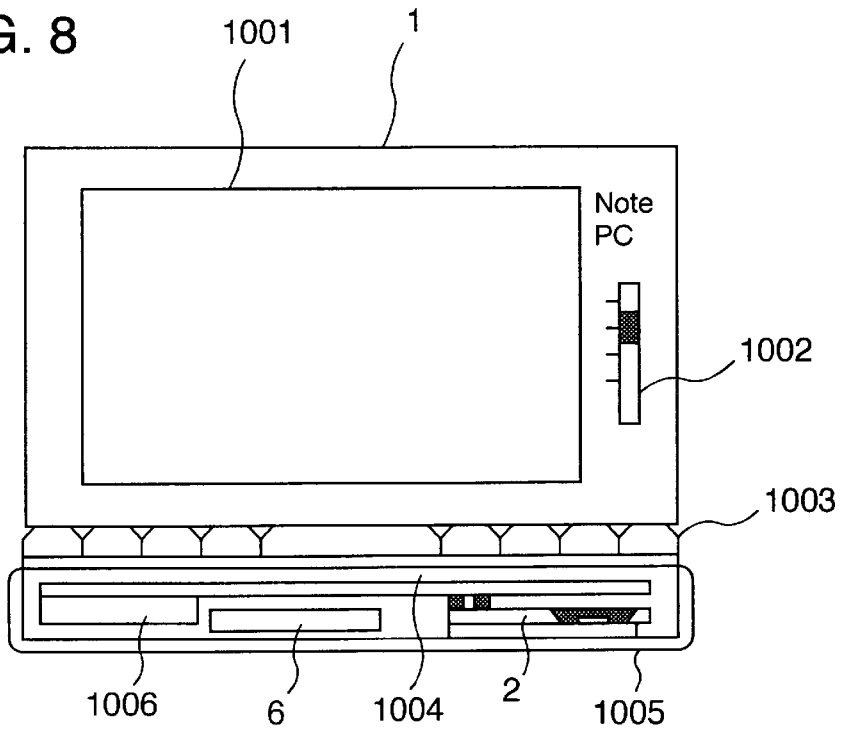
FIG. 8 is a view showing a first mounting example of the CPU module according to the invention to a notebook personal computer.

FIG. 8 shows the mount of the CPU module to a notebook personal computer. The information processing apparatus 1 takes a form of a notebook personal computer and includes a LCD panel 1001, an adjusting volume 1002 and so forth.

The CPU module 2 is connected to a mother board 1004. The metal plate 102 of the CPU module 2 is mounted in a lower box 1005. For the second embodiment, the heat pipe 110 of the CPU module 2 is mounted to the lower box 1005. This structure makes it possible basically not to conduct heat to the mother board 1004 but to mainly conduct heat to the lower box 1005, thereby inhibiting conduction of heat to the keyboard 1003. Since the keyboard is not heated, the resulting information processing apparatus does not give an uncomfortable feeling to a user who operates the apparatus 1.

A numeral 1006 in FIG. 8 denotes a PC card socket. Of the components mounted to the mother board of the notebook personal computer, this PC card socket has the highest physical height. The standard size of the PC card socket is defined by the PCMCIA. The two-stepped general-purpose PC card socket needs to have a height of 10.5 mm. The composition of the present invention reduces the height of the CPU module to 10 mm. or lower, so that the height restriction imposed by the CPU module may be reduced in designing the notebook personal computer.

Further, in order to keep the metal plate (heat sink) side of the CPU module 2 in contact with the lower box 1005, there has been known a method for using a thin heat conductive sheet and a method for coating silicon grease, for example.

Figure 9:
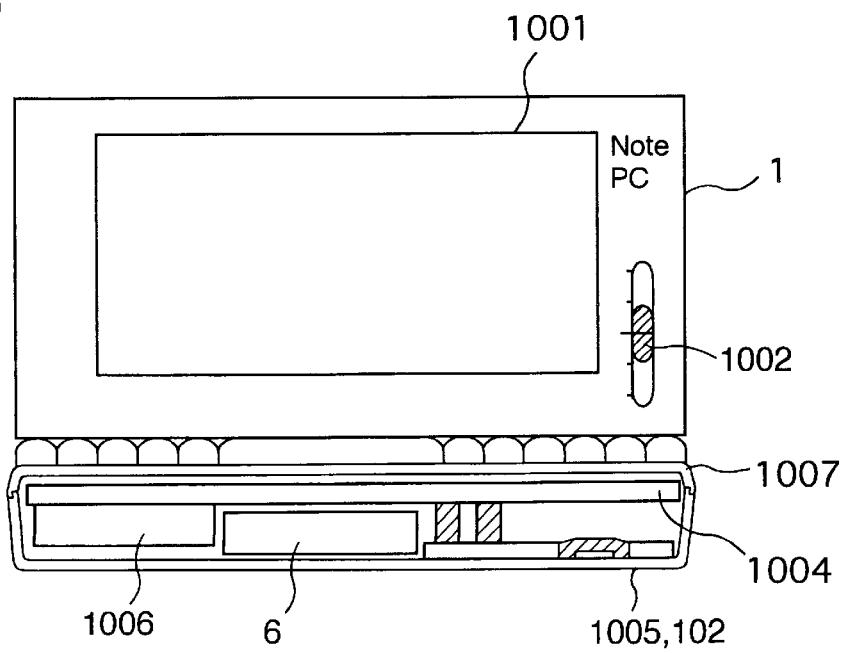
FIG. 9 is a view showing a second mounting example of the CPU module according to the invention to a notebook personal computer.

FIG. 9 shows the second application of the present CPU module to the notebook personal computer. This is composed by integrally combining the metal plate 102 with the metallic lower box 1005. The lower box 1005 combined with the metal plate 102 is tightly pressured on an upper box 1007 for the purpose of effectively forming an electromagnetic shield of the overall system. For this purpose, it is preferable to use the CPU module of the first embodiment.

Figure 10:
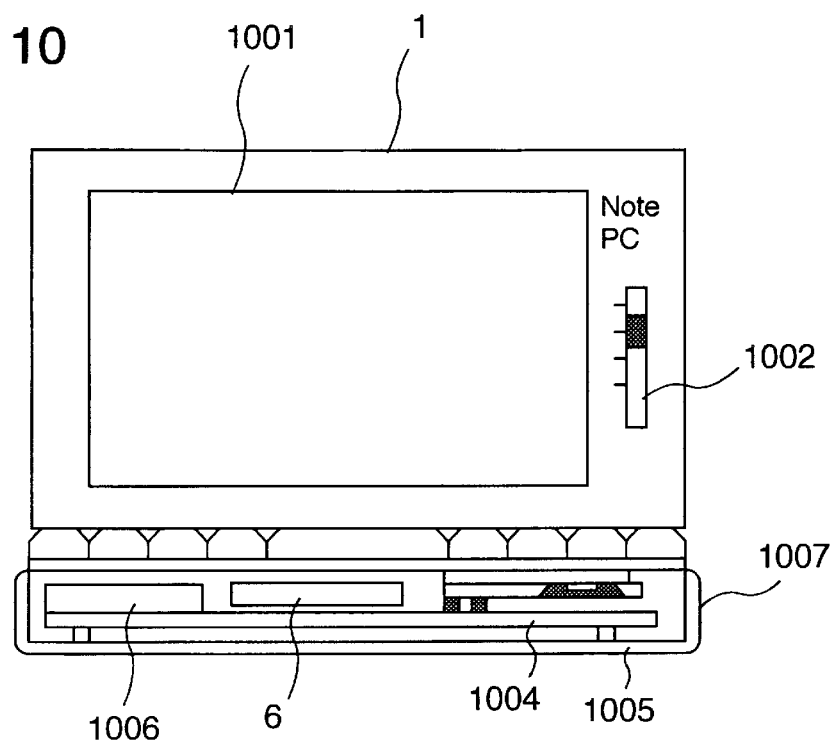
FIG. 10 is a view showing a third mounting example of the CPU module according to the invention to a notebook personal computer.

FIG. 10 shows the third application of the present CPU module to the notebook personal computer. This is the mount of the mother board in the lower box 1005. This structure may implement the information processing structure on the basis of the concept of allowing the keyboard 1003 to be somewhat heated.

In this structure, when heat is locally conducted to the keyboard 1003, the user feels an uncomfortable feeling. Hence, the structure is required to dissipate heat uniformly in a wider range. For this purpose, any CPU module according to the first embodiment or the second embodiment may be used. In actual, it is more effective to use the circuit module of the second embodiment for suppressing the temperature rise of the keyboard and reducing an uncomfortable heat-based feeding to be given to the user.

The foregoing description has been expanded with respect to the wire-bonding connection in the face-up state of keeping the side on which the bare chip circuit and a pad are formed on the sane side where the CPU bare chip 20 is connected to the printed board. The following description will be expanded with respect to a FCA (Flip Chip Attach) connection in a face-down state of keeping the side where the bare chip circuit and the pad are formed on the opposite side where the CPU bare chip is connected to the printed board.

Figure 11:
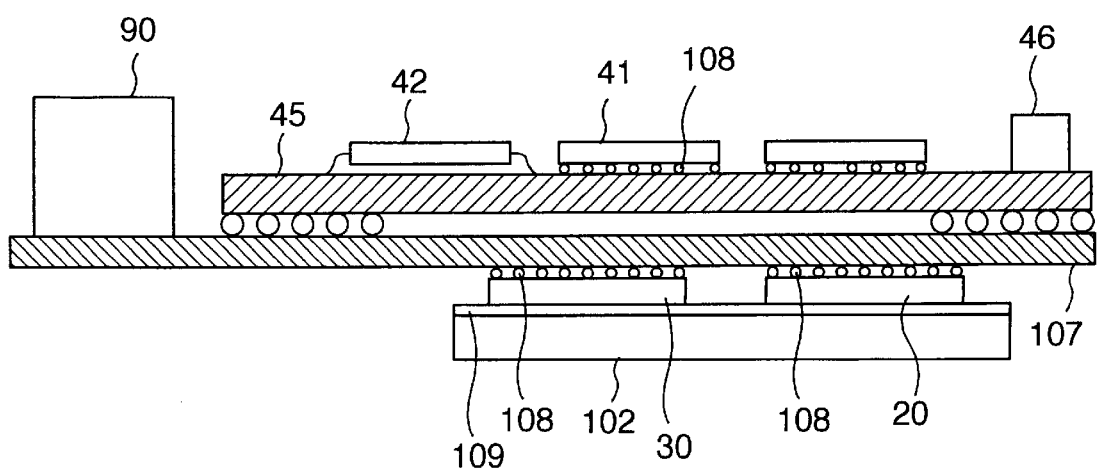
FIG. 11 is an explanatory view showing a face-down type CPU module.

FIG. 11 shows a face-down module. A numeral 46 denotes a chip component to be mounted on the cache sub-module 40. A numeral 108 denotes a gold bump. The CPU bare chip 20 is directly connected to the CPU module substrate after forming not the bonding wire but the solder bump or the gold bump 108.

In this module, the system controller 30 is connected in a similar manner to the connection of the CPU bare chip 20. The system controller 30 is connected to the metal plate 102 through a conducting buffer material 109. The buffer material 109 serves to absorb the vertical dimensional slip of the bare chips off the CPU module substrates 101 and efficiently conduct heat to the metal plate 102.

This structure makes it possible to dissipate heat directly from the chip even in the face-down mount. The structure has a shorter power feeding and signal wiring pattern than the wire bonding, so that its mounting density is made higher. This enables to operate the CPU at a faster speed.

FIG. 11 illustrates the method for mounting a memory cell for storing pare of addresses of the cached data on the main storage as a memory cell for storing the cached data as taking a form of the cache sub-module 40 with the two-stepped substrate. This structure does not necessarily take the sub-module form. In place, it is possible to take the method for directly mounting the memory element on the CPU module substrate 101.

Figure 13:
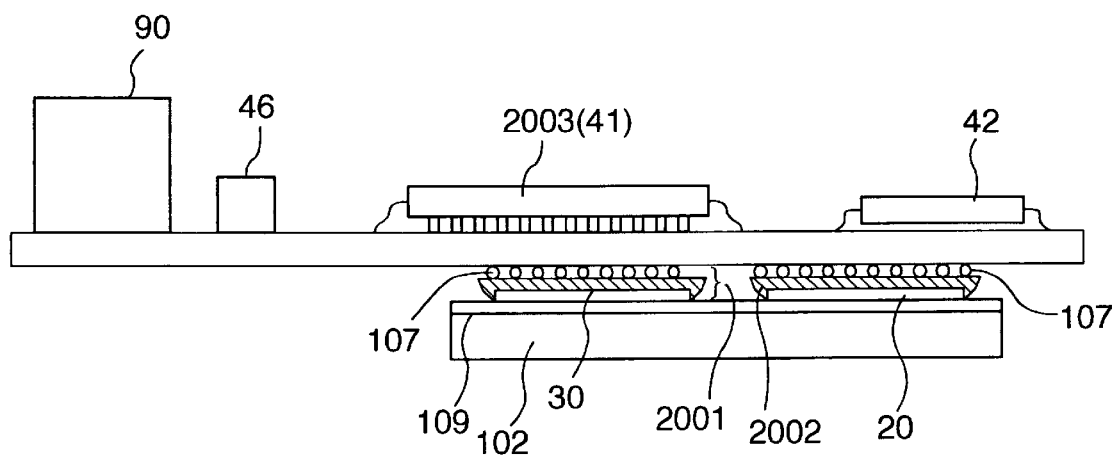
FIG. 13 is a view showing a CPU module on which a chip-size-packaged processor is mounted.

The smallest component in size is a bare chip. However, in the face-down state, the wiring pitch on the substrate depends on a pad dimension of a silicon bare chip. Hence, it is necessary to create a very fine pitched substrate. This makes the substrate very costly and inhibits to raise a manufacturing yield. In order to overcome this shortcoming, in recent days, there has been developed a CSP (Chip Size Package), which is an IC package of the substantially same projection area. The module composed to use the CSP is shown in FIG. 13. In FIG. 13, a numeral 2001 denotes the CSP. A numeral 2002 denotes a CSP mold. A numeral 2003 denotes a QFP (Quad Flat Package). The use of the CSP makes it possible to compose the same module as the module composed by mounting the bare chip with the FCA. FIG. 13 shows the CSP from which the chip is exposed. In place, if the chip of the CSP is covered with any material, though the CSP may have a somewhat larger the heat resistance, this type of CSP may be also used unless the heat resistance is critical.

FIG. 11 illustrates the cache sub-module with the bare chip, while FIG. 13 illustrates the direct mount of the QFP and the TSOP on the substrate. The CPU module may be composed in the form of the sub-module of the two-stepped substrate or in the form of the direct mount of a package type IC. The mounting form of the CPU and name system controller may be realized by any form as shown in FIGS. 1, 11 and 13. Any combination of the mounting forms of the cache sub-module and the CPU is made possible.

The use of the present invention makes it possible to provide the information processing apparatus with an efficient cooling design. Further, it also makes it possible to achieve a heat-releasing design though the design is thin and lightweight, so that the user cannot feels an uncomfortable feeding when he or she uses the information processing apparatus of this design. Moreover, the present invention may offer the CPU module that may easily form an electromagnetic shield.

The present invention further offers the effect of enhancing the efficiency of releasing heat by taking the form of the one-side mounting wherein the bare chip CPU is directly connected to a thermal diffusion plate and the other electronic components are mounted only on the CPU-connected side of the diffusion plate as well as facilitating the design of the heat-releasing structure of the information processing apparatus by making the heat interface substantially planar.

Since the other side of the thermal diffusion plate contains no electronic circuits and components mounted thereon, the application of metal to the thermal diffusion plate makes it possible to utilize the thermal diffusion plate as part of the electromagnetic shield. This is more effective in preventing radiation noises.

Moreover, a less thermally conductive resin such as acrylic resin (thermal conductivity (room temperature): 0.17–0.25 W/mK) is used for sealing the bare chip CPU with a great heat release and a thin air layer is formed between the resin layer and an upper circuit. Hence, these two factors offer a sufficiently larger heat resistance to the upper circuit than the thermal diffusion plate such as a copper plate (thermal conductivity (0° C.): 403 W/mK). This makes it possible to isolate heat in a short distance so that another electronic circuit may be mounted closer to the CPU. This results in offering the effects of enhancing the mounting density and providing such a thin information processing apparatus as not giving a thermally uncomfortable feeling to the user.

The electronic components packaged with the bare chip are most approximately selected so as to achieve the high-density mounting. This results in reducing the information processing apparatus in size. Since the high-density mounting leads to shortening signal and power wiring patterns, the operating margin of the system is so large that the higher reliability can be secured. Further, the operating margin defined on a certain criterion leads to speeding up the signal transfer and implementing a high-efficient information processing apparatus.

According to the invention, the height of the CPU module is suppressed to 10 mm, because the processor is mounted in the cavity and all relevant components are mounted on the side where the highest component, the connector, is mounted. This means that when the CPU module is mounted to the information processing apparatus, the height of the CPU module is suppressed to be lower than the highest component, a PC card slot, among the other components of the apparatus. Hence, the height of the CPU module does not have an effect on the overall box when it is mounted to the mother board. It makes great contribution to making the information processing apparatus thinner.

The CPU module according to the second embodiment makes it possible to uniformly release heat in a wider range by combining one or two or more of the heat pipes whose lengthwise and lateral sizes are great, thereby implementing such a thin information processing apparatus as not giving a thermally uncomfortable feeling to the user.

What is claimed is:

1. A CPU module comprising:

a processor;

a connector to be electrically connected to the outside;

a system control circuit for controlling transfer of a signal between said processor and said connector;

a printed board on which said processor, said connector and said system control circuit are to be mounted; and a heat release plate pasted with one side of said printed board;

wherein said printed board has a cavity formed therein and said processor is fitted in said cavity in a bare-chip state and one side of said bare chip is jointed with said heat release plate;

wherein said cavity is sealed by a member having a lower thermal conductivity than said heat release plate; and wherein a second step substrate is mounted on the top of said sealed cavity with a small gap laid therebetween and electronic components are mounted on the second step substrate.

2. The CPU module as claimed in claim 3, wherein said electronic components are a cache memory and a cache memory control mechanism.

3. A CPU module comprising:

a processor;

a connector to be electrically connected to the outside;

a system control circuit for controlling transfer of a signal between said processor and said connector;

a printed board on which said processor, said connector and said system control circuit are to be mounted; and a heat release plate pasted with one side of said printed board;

wherein said printed board has a cavity formed therein and said processor is fitted in said cavity in a bare-chip state and one side of said bare chip is jointed with said heat release plate;

wherein said cavity is sealed by a member having a lower thermal conductivity than said heat release plate;

wherein a second step substrate is mounted on the top of said sealed cavity with a small gap laid therebetween and electronic components are mounted on the second step substrate;

wherein said electronic components are a cache memory and a cache memory control mechanism; and wherein the cache memory is mounted on said second step substrate in a bare-chip state.

4. A CPU module comprising:

a processor;

a connector to be electrically connected to the outside;

a system control circuit for controlling transfer of a signal between said processor and said connector;

a printed board on which said processor, said connector and said system control circuit are to be mounted; and a heat release plate pasted with one side of said printed board;

wherein said printed board has a cavity formed therein and said processor is fitted in said cavity in a bare-chip state and one side of said bare chip is jointed with said heat release plate; and wherein said connector is connected with a memory bus to be connected with at least a main storage unit and with a system bus to be connected with an I/O device.

5. An information processing apparatus having a mother board on which semiconductor components are mounted and a box in which said mother board is mounted, comprising:

a plurality of semiconductor elements and electronic components to be mounted on said mother board;

a daughter board on which said semiconductor elements and said electronic components are mounted;

said daughter board having a heat release plate, one side of which is jointed therewith; and wherein said daughter board contains a cavity formed therein, one of said semiconductor elements with a great heat release is fitted in said cavity, and one side of said one semiconductor element is jointed with one side of said heat release plate so that said heat release plate is in contact with an inside of said box.

6. An information processing apparatus having a mother board on which semiconductor components such as a storage unit are mounted, a box in which said mother board is mounted, and a shield enclosure for an electromagnetic shield, comprising:

a CPU module composed of a processor and a heat release plate, a connector to be electrically connected with the outside, a system control circuit for controlling transfer of a signal between said processor and said connector, and a printed board on which said processor, said connector and said system control circuit are mounted, said printed board having a cavity formed therein, said processor being mounted in said cavity in a bare-chip state, and one side of said bare chip being jointed with said heat release plate, and wherein said CPU module is connected to said mother board so that said CPU module composes part of said enclosure.

7. An information processing apparatus having a semiconductor components such as a storage unit, a mother board on which a PC card connector is mounted, and a box in which said mother board is mounted, comprising:

a circuit module composed of plural semiconductor elements, electric components, and a printed board on which said semiconductor elements and said electronic components are mounted, said circuit module providing a heat release plate jointed with said printed board on one side; and wherein said printed board has a cavity formed therein, one of said semiconductor elements with a great heat release is fitted in said cavity, one side of said one semiconductor element is jointed with one side of said heat release plate, and said circuit module is mounted to said PC-card-connector mounted side of said mother board so that said heat release plate is in contact with an inside of said box.

8. An information processing apparatus comprising:

a mother board on which semiconductor components such as a storage unit and a PC card connector are mounted;

a box inside of which said mother board is mounted;

a circuit module composed of plural semiconductor elements, electronic components, and a printed board on which said semiconductor elements and said electronic components are mounted; and said circuit module being mounted on said mother board so that said circuit module has the maximum height of 10 mm. or less from the mounting plane of said mother board.

9. An information processing apparatus comprising:

a mother board on which semiconductor components such as a storage unit and a PC card connector are mounted;

a box having said mother board mounted therein;

a CPU module composed of a processor, a connector to be electrically connected with the outside, a system control circuit for controlling transfer of a signal between said processor and said connector, and a printed board on which said processor, said connector and said system control circuit are mounted; and said CPU module being mounted onto said mother board so that said CPU module has the maximum height of 10 mm. or less from the mounting plane of said mother board.

10. A CPU module comprising:

a processor;

a connector to be electrically connected with the outside;

a system control circuit for controlling transfer of a signal between said processor and said connector;

a printed board on which said processor, said connector and said system control circuit are mounted; and wherein said processor is mounted on the opposite side to the side having said system controller and said connector mounted thereon in a bare-chip state by means of a metallic bump and the opposite side to said bare-chip mounted side is connected with heat release plate with a highly thermal conductive and elastic buffer agent laid therebetween.

11. A CPU module comprising:

a processor;

a connector to be electrically connected to the outside;

a system control circuit for controlling transfer of a signal between said processor and said connector;

a printed board on which said processor, said connector and said system control circuit are mounted; and wherein said processor is mounted on the opposite side to the side on which said system controller and said processor are mounted by means of a metallic bump, said processor being packaged so that only the surface covered with no silicon chip pad is exposed, and the opposite side to said silicon chip mounting side is connected with a heat release plate with a highly thermal conductive and elastic buffer agent laid therebetween.

12. A circuit module comprising:

plural semiconductor elements;

plural electronic components;

a printed board on which said semiconductor elements are electronic components are mounted;

said semiconductor elements with a great heat release being mounted on the opposite side to the side on which said semiconductor elements and said electronic components are mounted and in a bare-chip state by means of a metallic bump and the opposite side to the bare-chip mounted side is jointed with an integral mold of a heat pipe and a metal plate through a highly conductive and elastic buffer material.

13. A circuit module comprising:

plural semiconductor elements;

electric components;

a printed board on which said semiconductor elements and said electric components are mounted;

the semiconductor element with a great heat release being mounted on the opposite side to the side on which said semiconductor elements and electronic components are mounted by means of a metallic bump, said semiconductor element being packaged so that only the surface covered with no silicon chip pad is exposed, and the opposite side to said silicon chip mounting side is jointed with an integral mold of a heat pipe and a metal plate through a highly thermal conductive and elastic buffer material.

* * * * *